United States Patent [19]

Jones, II et al.

[11] Patent Number: 4,861,944
[45] Date of Patent: Aug. 29, 1989

[54] LOW COST, HERMETIC PIN GRID ARRAY PACKAGE

[75] Inventors: Kenneth L. Jones, II, Escondido; Tom R. O'Connor, San Marcos; Kenneth A. Trevellyan, San Diego, all of Calif.

[73] Assignee: Cabot Electronics Ceramics, Inc., San Diego, Calif.

[21] Appl. No.: 130,469

[22] Filed: Dec. 9, 1987

[51] Int. Cl.$^4$ .............................................. H05K 01/18
[52] U.S. Cl. .................................... 174/68.5; 174/50.6; 29/842; 361/406
[58] Field of Search ........................ 361/406; 420/505; 29/841, 842, 843, 844, 845; 174/68.5, 50.6

[56] References Cited

U.S. PATENT DOCUMENTS

| | | | |
|---|---|---|---|
| 2,450,340 | 9/1948 | Hensel et al. | 420/505 |
| 2,586,854 | 2/1952 | Myers | 174/68.5 |
| 3,006,069 | 10/1961 | Rhoads et al. | 29/843 X |
| 3,205,297 | 9/1965 | Brock | 174/68.5 |
| 3,254,279 | 5/1966 | Cohn et al. | 420/505 X |
| 3,257,704 | 6/1966 | Hafner | 29/25.35 |
| 3,281,923 | 11/1966 | Best et al. | 29/844 |
| 3,307,246 | 3/1967 | Gulliksen et al. | 174/68.5 |
| 3,489,879 | 1/1970 | Salzer | 219/152 |
| 3,545,606 | 12/1970 | Bennett | 29/203 |
| 3,568,301 | 3/1971 | Shibata | 29/471.3 |
| 3,730,969 | 5/1973 | Buttle | 174/525 |
| 3,941,297 | 3/1976 | Burns | 228/180 A |
| 4,069,963 | 1/1978 | Prasad | 228/179 |
| 4,246,627 | 1/1981 | Poensgen | 361/405 |
| 4,412,642 | 11/1983 | Fisher | 29/843 X |
| 4,550,493 | 11/1985 | Darrow | 29/739 |
| 4,551,789 | 11/1985 | Schettler | 361/406 |
| 4,631,821 | 12/1986 | Houser | 29/845 |

FOREIGN PATENT DOCUMENTS

| | | | |
|---|---|---|---|
| 854593 | 11/1960 | United Kingdom | 174/263 |
| 1177831 | 1/1970 | United Kingdom | 29/845 |

OTHER PUBLICATIONS

Darrow et al., Increased Wiring Area for Standard Pinned Substrates, IBM Tech. Discl. Bull., V. 25, #1, Jun. 1982, p. 288.

Primary Examiner—R. R. Kucia
Attorney, Agent, or Firm—Gregory O. Garmong

[57] ABSTRACT

A pin grid array package includes an electrically insulating, moisture impervious base having a plurality of bores therethrough, electrically conducting pins extending through the bores, metallic collars wedged between the pins and the bores adjacent the bottom side of the base, an electrically conducting trace formed by a silver-2 percent platinum alloy extending from each pin to the location for attachement of an electrical device, and a melted eutectic bond between the metal of the conducting path and the head of the pin at the top side of the base.

18 Claims, 3 Drawing Sheets

LOW COST, HERMETIC PIN GRID ARRAY PACKAGE

BACKGROUND OF THE INVENTION

This invention relates to the packaging of electronic devices, and, more particularly, to the structure upon which integrated circuits and the like are supported for inserting into an electronic circuit assembly.

Integrated circuits are electronic devices that are extremely miniaturized, so that hundreds or even thousands of individual circuits and active elements are formed on a chip that may be only ¼ inch on a side. The reduction in size of such circuits reduces their weight and volume requirements, and also increases their operating speeds because the distances that electrons must travel are reduced. The widespread adoption of integrated circuitry has revolutionized many areas of electronics.

The integrated circuits themselves are extremely small and fragile. They must therefore be packaged and protected in a manner that permits external electrical connections to be made, and permits the integrated circuits to be handled in a normal manner during the assembly and repair of electronic devices that may utilize one or many such packaged integrated circuits.

One approach to packaging is to attach the integrated circuit to a substrate. The substrate supports the integrated circuit, and provides electrical connection points. Fine wires are attached between pads on the integrated circuit and pads on the substrate, and typically electrical conductor paths (termed "traces") extend from the pads on the substrate to other locations on the substrate that are spaced apart sufficiently that external connections can be readily made.

The substrate is normally electrically nonconducting, so that there is a natural insulation barrier between the various conductor traces that run across the surface of the substrate. The mounted integrated circuit is also electrically isolated on its bottom side, and can be electrically isolated on the top side by applying an insulation layer. One popular material of construction of the substrate is an organic resin material that is readily formed and also is nonconducting. These resin boards, known as printed circuit boards, are often found inside commercial and industrial electronic systems such as computers, radios, and televisions. Mounting of the integrated circuit on the resin board insulates it electrically from the surroundings on its bottom side, and a layer of liquid resin is often spread over the top of the integrated circuit and allowed to harden, to electrically insulate the integrated circuit on the top side.

An alternative approach has been to use a piece of ceramic as a substrate, and to join the integrated circuit to the ceramic base. Metallic conductor traces run across the surface of the substrate to provide external electrical connections. A cover can be attached over the integrated circuit to protect it. Such a package is known as a hermetic package, because it provides an electrically insulating, long-lasting, completely sealed support for the electronic device mounted upon it that is impervious to external substances such as moisture that could damage the integrated circuit. The preparation of hermetic packages presents different, and typically more complex, problems than does the preparation of nonhermetic packages, which are not impervious to moisture, because of restrictions on the materials and techniques of construction. The present invention deals with such hermetic packaging for electronic devices.

One important type of hermetic package is the pin grid array, known as a PGA. The pin grid array package has an electronic device attached to a top side thereof, and electrical conduction traces running across the top surface of the ceramic. In many cases there are multiple levels of ceramic layers and conduction traces thereupon, to provide a sufficiently low resistance conduction path and also to permit desired interconnections within the package. Electrically conducting pins extend outwardly from the package, typically in an array that extends downwardly from the bottom side of the ceramic base, opposite the top side where the electronic device is mounted. The pins can be inserted into a conforming socket in a larger electronic system, permitting easy installation and removal of the package and its contained electronic device.

The cost of pin grid array packages, not including the cost of the integrated circuit mounted upon the package, is normally stated in a number of cents per pin of the array. The cost of currently available single level PGA packages (that is, having a single ceramic substrate and not multiple layers of ceramic) is about 5-7 cents per pin. The materials of construction of the package contribute a small fraction of this cost.

Most of the cost of conventional PGA packages is incurred in the complex series of steps required to fabricate the package. Thus, cost is a way of expressing the totality of the technical difficulties in preparing the package. Conducting channels termed vias are formed through the ceramic substrate, and the pins are attached to one side of the vias. Several types of electrically conducting materials are used in the conducting traces on the top side of the base and connected together end to end to form series paths. The portion of the trace nearest the integrated circuit is gold to permit attachment to aluminum wires extending to the integrated circuit. The portion of the trace adjacent the vias is an alloy of silver and palladium to prevent leaching of the silver into the solder used to connect the two. The intermediate portion of the trace is silver. Each portion of the path must be separately deposited on the substrate. Yields of final, good quality packages are reduced as the number of individual steps increases, simply because there are always some failures in each individual step. The complex structure is also prone to service failures related to the mode of fabrication, such as failures at the joints between the various segments of the top-surface conduction traces or separation of the pins.

For these and other reasons, the cost of single level, hermetic pin grid array packages has remained relatively high. It would be desirable to develop a pin grid array package that has significantly reduced cost, reflecting a technically less complex method of fabrication, and is also of simpler construction so as to be more reliable in service. The present invention fulfills this need, and further provides related advantages.

SUMMARY OF THE INVENTION

The present invention provides a hermetic pin grid array package for electronic devices having reduces costs and fabrication complexity due to the significantly reduced number of fabrication steps required, as compared with conventional pin grid assemblies. The packaging is more reliable in service than prior packages used in comparable functions, because of the reduced complexity of the structure and structural changes. The package permits reduction of the packaging complexity for certain applications, because higher electrical conductivity can be achieved in the top-surface conduction traces so that a single level of conduction traces is sufficient, where previously multiple levels had been required.

In accordance with the invention, a hermetic pin grid array package for supporting an electronic device comprises an electrically insulating, moisture impervious base having a plurality of bores therethrough and adapted for supporting the electronic device at a device location thereupon; a plurality of electrically conducting pins formed of a copper containing alloy, one extending through each of the bores, the pins communicating with a top side of the base and extending through the base to emerge on a bottom side of the base; a plurality of metallic collars, one surrounding each of the pins and positioned to contact the bottom side of the base where the pin emerges from the base, each of the collars being wedged between the pin and the bore to exclude foreign matter from entering into the bore from the bottom side of the base; means for electrically connecting the pins to the electronic device in a selected pattern, the means including a metallic conductor trace imprinted upon the base and extending from a point adjacent the device location to one of the pins, the metallic conductor trace being a metallic alloy consisting essentially of silver plus from about 1.5 weight percent to about 2.5 weight percent platinum; and a melted copper-silver eutectic bond between each of the pins and the portion of the metallic conductor trace adjacent the pin.

The base is preferably made of a ceramic material, such as aluminum oxide, beryllium oxide, or aluminum nitride, most preferably aluminum oxide. The ceramic base is preferably a piece of 90 to 96 percent purity black aluminum oxide, $Al_2O_3$, of thickness about 0.060 inches and sufficient lateral extent to accommodate the integrated circuit, the pins, and the electrical conductor paths. The base may be fabricated from other ceramic materials such as beryllium oxide or aluminum nitride. A plurality of bores, each preferably about 0.022 inches in diameter, is formed vertically through the thickness of the base. One bore is provided for each pin. The pins are sized to fit through the bores, and are typically about 0.019 inches in diameter for the preferred 0.022 inch diameter bores, leaving a clearance gap of 0.003 inches to permit insertion. In a typical base, there might be from 6 to 200 or more pins.

A plurality of small rings of metal are deposited upon the bottom side of the base to form the collars. The collars are preferably from about 0.0005 to about 0.001 inches thick and formed of an alloy of silver and about 20-30 weight percent palladium. The collars overlap the bores slightly.

The pins are preferably made of a copper-based alloy, overplated with a layer of nickel about 0.00004 inches (40 microinches) thick and, over the nickel, a layer of gold about 0.0000020 to about 0.000040 inches (20 to 40 microinches) thick. The pins are enlarged at an intermediate position along their length. The diameter of the pins is essentially constant along the length that is within the bores, but is gradually increased to about 0.025 inches below the base. During assembly, the pin is drawn upwardly to seat the pin in the bore, with the collar wedged between the outer diameter of the pin and the inner diameter of the bore. This wedging of the collar seals the clearance space between the pin and the inner diameter of the bore against intrusion of foreign matter into the clearance space. Specifically, in subsequent cleaning steps the bottom side of the base is exposed to a corrosive liquid. In a device that did not have the wedged collar, the corrosive liquid could seep into the clearance space to initiate long-term corrosion of the pins, which could lead to failure of one or more of the pins, and thence the package. The present approach avoids this problem.

The electrical conduction trace from the top of the pins to the location of the electronic device is made of a single metal, preferably an alloy of silver and about 2 weight percent platinum. This alloy has been found to have sufficiently high electrical conductivity to permit use of a single layer. The alloy also does not exhibit harmful metallurgical structures at the interface when soldered to aluminum connection wires and does not exhibit whisker growth within a covered cavity adjacent the electronic device that can lead to shorting of the conduction traces to adjacent conduction traces. The use of a single alloy along the entire length of the conduction trace eliminates several production steps, and increases the reliability of the package because there are no joints to fail in the conduction trace.

During assembly and fabrication of the package, the pins are inserted into the bores from the bottom side of the base. The pins are axially dimensioned so that the top ends of the pins protrude above the top surface of the base. The pins are joined to the base by upsetting the pins under heat and pressure. An axial force is applied to the pins from the bottom and the top ends. The axial force wedges the pins against the collars to seal the bores at the bottom ends. It also causes the pins to expand slightly against the inner diameter of the bores. The top end of the pins is upset outwardly into contact with the electrical conductor material.

Simultaneously, the top end of the pins and the electrical conductor material are heated to a temperature below the melting temperature of either material. The two materials are selected to form a melted eutectic structure therebetween. Eutectic structures have melting points lower than that of their constituents. The pins and electrical conductor material are heated to a temperature that is above the melting temperature of the eutectic, so that a molten eutectic is formed between the two, but is below the melting point of the pins and traces so they remain intact. The melted eutectic region creates a conductive metallic bond between the pin and the conductive path material. The bond is typically not formed around the entire circumference of the pin, but only at a few local positions. These melted areas are sufficient, however, to firmly bond the pins to the base and to provide an electrical contact between the pins and the conduction path.

In another embodiment in accordance with the present invention, a hermetic pin grid array package for supporting an electronic device comprises an electrically insulating, moisture impervious base having a plurality of bores therethrough and adapted for supporting the electronic device thereupon at a device location; a plurality of electrically conducting pins, one pin extending through each of the bores and having a size of the portion of the pin within the bore that is less than the size of the bore so that there is a clearance gap between the pin and the bore, the pins communicating with a top side of the base and extending through the base to emerge on a bottom side of the base; means for preventing foreign matter from entering into the clearance gap between each of the pins and the bores, from the bottom side of the base; and means for electrically connecting the pins to the electronic device in a selected pattern. Preferably, the means for preventing is a plurality of metallic collars, one around each of the pins and positioned to contact the bottom side of the base where the pin emerges from the base, each of the collars being wedged between the pin and the bore to prevent foreign matter from entering into the clearance gap from the bottom side of the base.

In yet another embodiment in accordance with the invention, a hermetic pin grid array package for supporting an electronic device comprises an electrically insulating, moisture impervious base having a plurality of bores therethrough and adapted for supporting the electronic device thereupon at a device location; a plurality of electrically conducting pins, one extending through each of the bores, the pins communicating with a top side of the base and extending through the base to emerge on a bottom side of the base; means for electrically connecting the pins to the electronic device in a selected pattern, the means including a metallic conductor adjacent the portion of the pins that communicates with the top side of the base, the composition of at least a portion of the pins and the metallic conductor being selected to form a eutectic alloy composition therebetween; and a melted bond between each of the pins and the portion of the metallic conductor adjacent the pin.

In yet another embodiment, a hermetic pin grid array package for supporting an electronic device comprises an electrically insulating, nonconducting base having a plurality of bores therethrough and adapted for supporting the electronic device at a device location thereupon; a plurality of electrically conducting pins, one extending through each of the bores, the pins communicating with a top side of the base and extending through the base to emerge on a bottom side of the base; and means for electrically connecting the pins to the electronic device in a selected pattern, the means including a metallic conductor trace imprinted upon the base and extending from a point adjacent the device location to one of the pins, the metallic conductor trace being formed of a metallic alloy consisting essentially of silver plus from about 1.5 weight percent to about 2.5 weight percent platinum.

With any of these embodiments, the structure discussed previously, as well as additional features, can be, and often are, applied to the package. For example, a glassy coating can be applied over the base and electrical conductors to protect and to insulate. A hard housing or cover can be fastened over the integrated circuit as further protection. A nonconducting, nonmetallic coating can be applied over the tops of the pins to prevent shortcircuiting between pins due to whisker growth over time.

It will be appreciated that the pin grid array package of the invention provides important advantages not otherwise obtainable in a pin grid array package. These various advantages are evidenced in a reduced cost of manufacturing due to reduced numbers of process steps and increased part yields. The reliability and performance of the package are also improved over prior approaches, because of the reduced complexity of the package. Other features and advantages of the present invention will be apparent from the following more detailed description of the preferred embodiment, taken in conjunction with the accompanying drawings, which illustrate, by way of example, the principles of the invention.

DETAILED DESCRIPTION OF THE PREFERRED EMBODIMENT

Figure 1:
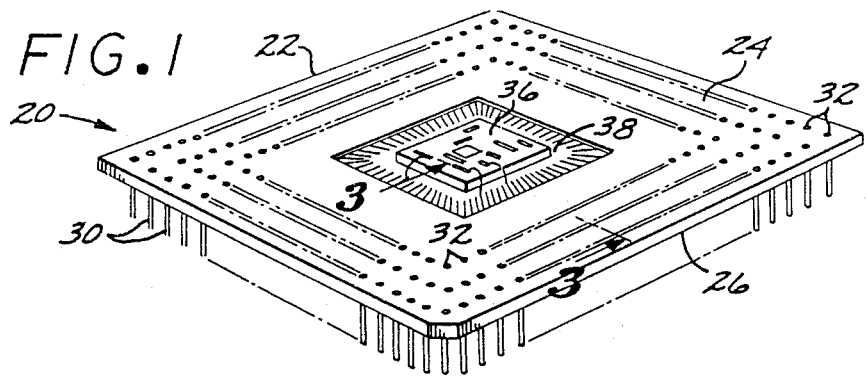
FIG. 1 is a top perspective view of the package of the invention.
Figure 2:
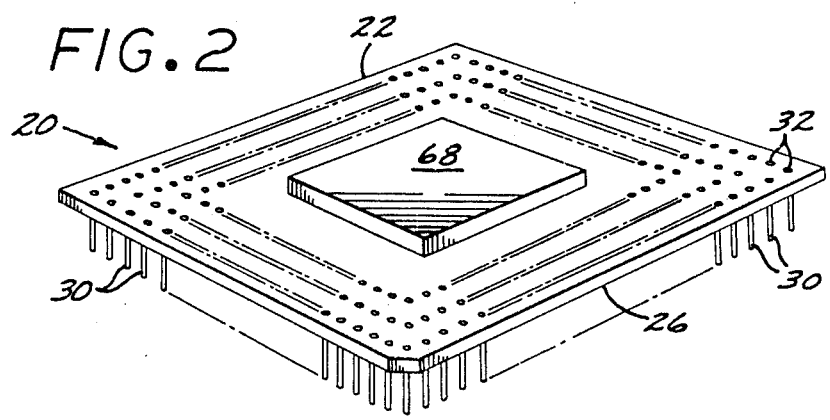
FIG. 2 is a top perspective view similar to that of FIG. 1, except that a protective cover has been placed over the electronic device.
Figure 3:
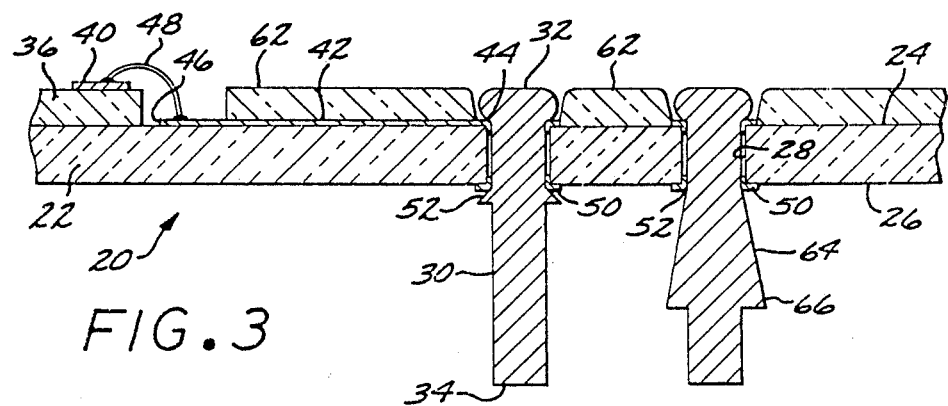
FIG. 3 is a side sectional view of the package of FIG. 1, taken on line 3—3.

The preferred embodiment of the invention is illustrated in FIGS. 1-7. Referring to FIGS. 1 and 3, a pin grid array package 20 includes a ceramic base 22 formed of 92-96 percent purity black aluminum oxide. In one form having 120 pins, the base 22 has dimensions of 1⅜ by 1⅜ inches on the face, and 0.060 inches thick, but the dimensions may be varied as necessary for particular applications. For reference purposes, the base 22 is said to have a top surface 24 and a bottom surface 26. The top surface 24 may be planar, but in some embodiments is not planar. Instead, the top surface 24 may have a depressed region or cavity formed therein near the center of the surface, so that the electronic device supported by the base 22 can be mounted within the cavity. This permits the top of the electronic device to be roughly flush with the remainder of the top surface 24, so that connections to the electronic device can be readily made. In the most preferred embodiment discussed herein, the top surface is generally planar, but the approach incorporating a cavity is within the scope of the invention.

A plurality of bores 28 extend through the base 22, perpendicular to the broad face of the base 22. A plurality of pins 30 pass through the bores 28, one pin through each bore. The diameter of the pin 30 is slightly less than the inside diameter of the bore 28, to provide a clearance gap between the pin and the bore that permits the pin to be readily inserted into the bore. By way of example, in a preferred structure the diameter of that portion of the pin 30 that is within the bore 28 is about 0.019 inches, and the inner diameter of the bore 28 is about 0.022 inches, leaving a 0.003 inch clearance gap.

The top 32 of the pin 30 extends and protrudes above the top surface 24 of the base 22, and thus "communicates" with the top surface 24 as that term is used herein. The pin 30 passes through the body of the base 22 and extends below the bottom surface 26 of the base 22. The bottom 34 of the pin 30 extends well below the bottom surface 26 of the base 22, and it is the bottom 34 of the pin 30 that plugs into a conforming socket or printed circuit board (not shown) in a device.

This approach to pin structure can be contrasted with that used in most prior packages of this type. In the prior approach, the bores through the base were filled with a conductive metal, which were known as vias, and then the pins were brazed to the vias. It was not uncommon for pins to break free from the vias, resulting in device failure. In the present approach, the pins 30 pass entirely through the body of the base 22, resulting in a much stronger pin and base structure.

An electronic device, here illustrated as an integrated circuit 36, is supported on the top surface 26 of the base 22, typically at a device location 38 near its center. A large number of types of electronic devices are known. The specific type and construction of the electronic device does not form a part of the present invention, although the combination of the package and the electronic device is a form of the invention. The integrated circuit includes an active portion that typically has many circuit elements, and pads 40 that act as external inputs and outputs to the active portion. A primary function of the package 20 is to provide connection of the pads 40 to the outside world, through the appropriate pins 30.

Each of the required electrical connections to the pins 30 is provided by an elongated electrical conduction trace 42 that is deposited onto the top surface 24 of the base 22, that is, the same surface where the integrated circuit 36 is mounted. A first end 44 of the electrical conduction trace 42 is adjacent the top 32 of the pin 30, and a second end 46 is adjacent the device location 38 where the integrated circuit 36 is affixed. A fine wire 44, typically made of aluminum, extends from the second end 46 to the appropriate pad 40 on the integrated circuit 36.

The entire length of the electrical conduction trace 42 is made of an alloy of silver and about 2 weight percent platinum. Preferably, the alloy of silver and platinum is screen printed through a mask onto the top surface 24, to a final thickness of about 0.0006 inch. In this deposition approach, the proper proportions of powders of the metals are slurried in an organic binder such as ethyl cellulose or nitro cellulose. The slurry is deposited onto the surface through a mask that has been patterned with appropriate openings, and the organic portion of the binder evaporated. Subsequent heat treatments sinter the powders. If more than about 2.5 weight percent platinum is present in the final alloy, the electrical conductivity of the conduction trace 42 is reduced to unacceptably low levels. If less than about 1.5 weight percent platinum is present, there is a tendency for the nearly pure silver alloy to grow fine whiskers during prolonged use. The fine whiskers can eventually grow sufficiently long to contact an adjacent pad or conduction trace, resulting in shorting of the conduction traces and possible failure of the device. The aluminum fine wire 48 can be soldered to the second end 46 without creating circumstances conducive to the Kirkendall effect, which produces a condition known in the industry as "purple plague".

The use of a single metal to form the entire length of the conduction trace can be contrasted with the prior approach. In most single level packages in the art, three different alloys were used along the length of the conduction trace. Adjacent the pins at the first end of the conduction trace, an alloy of silver and about 20 to about 30 percent palladium was used to permit soldering of the via to the conduction path. Adjacent the device location at the second end of the conduction trace, the conduction trace was made of gold, to avoid the formation of whiskers. In the central portion of the conduction trace between the ends, the conduction trace was pure silver, which has a high conductivity and is less expensive than gold. This three-part conduction trace required that each metal be separately deposited through separate masks. Each portion of the trace had to be properly joined to the adjacent portions at a join plane. Production yields were reduced due to the number of steps and the necessity of achieving a high-quality join plane. There were sometimes service failures when the join planes failed or parted, so that the conduction trace experienced an open circuit or increased resistivity. These problems are avoided by the use of the single metal for the entire conduction trace 42 of the present package 20.

The pin 30 is securely fixed to the base 22, and the conduction trace 42 electrically connected to the top 32 of the pin 30, by providing a particular structure and by setting the pin 30 by hot upsetting. A collar 50 is present around each of the pins 30, in the region where the pin 30 is adjacent the bottom surface 26 of the base 22. The collar 50 is formed of a deformable metal, preferably an alloy of silver and about 20–30 percent palladium, although the nature of the alloy and its composition are not critical. The collar 50 is preferably screen printed through a mask on the bottom surface 26 prior to insertion of the pins 30 therein, in the manner previously discussed, as a ring around the exit location of the bore 28 having a width of about 0.015 inches and a thickness of about 0.0006 inches. Preferably, the metal of the collar 50 is deposited to lie up to the edge of the bore, and slightly overlapping the bore so as to reach over the edge of the bore. Any such overlap must be very small, as the metal of the collar 50 cannot eliminate the clearance gap between the pin 30 and the diameter of the bore 28. The collar could also be a separate piece placed around the pin before it is inserted into the bore.

The pin 30 is manufactured with a slightly enlarged portion termed a collar engagement 52. The collar engagement 52 is an enlargement of the diameter of the pin 30 that is positioned on the pin at a location so as to be just below the bottom surface 26 of the base 22. By way of example, in the preferred embodiment of the pin 26 wherein the portion within the bore 28 has a diameter of 0.019 inches, the diameter is enlarged to 0.030 inches to form the collar engagement 52. The collar engagement 52 gradually slopes outwardly from the pin diameter to the engagement diameter.

The pin 30 is installed to the base 22 by inserting the top 32 upwardly through the base 22, until the collar engagement 52 contacts the collar 50, so that the pin 30 no longer moves upward easily. The pin 30 is then forced upwardly in an upsetting operation by a force applied to the bottom 34 of the pin 30, so that the collar engagement 52 is wedged into the bore 28, with the deformable collar 50 between the collar engagement 52 and the interior of the bore 28. The collar 50, wedged between the pin 30 and the bore 28, provides a seal that prevents foreign matter from flowing into the clearance space between the pin 30 and the bore 28. This seal is important in subsequent processing operations, where the bottoms 34 of the pins 30 are dipped into a corrosive liquid to clean the pins 30. In the absence of the seal, the corrosive liquid could penetrate into the clearance space, where it would reside and continue to corrode the pins 30 during their service life. Such corrosion could eventually cause the pins to fail, and the collar seal prevents the possibility of such corrosion. To accomplish this purpose, the collar remains intact with further processing, and is not melted or flowed into the clearance gap in the manner of a braze material.

Figure 4:
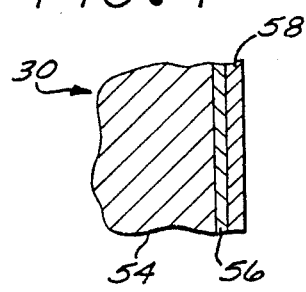
FIG. 4 is an enlarged side sectional view of a pin.
Figure 5:
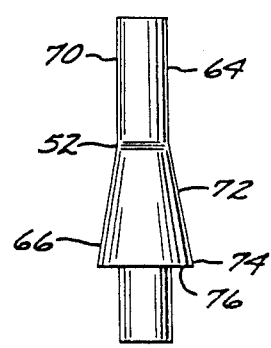
FIG. 5 is an elevational view of a stand-off pin.
Figure 6:
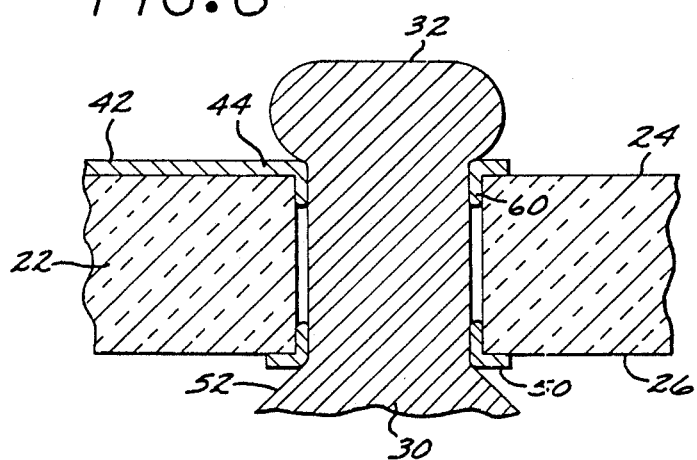
FIG. 6 is an enlarged side sectional view of the joint between an electrical conduction trace and a pin.

The top 32 of the pin 30 is joined to the first end 44 of the conduction path 42 in a eutectic and compression bond, during the same upsetting operation as just described. The structure of the pin 30 is illustrated in FIG. 4. The pin 30 is preferably made of a copper-based alloy to have reasonably high strength and good electrical conductivity. The preferred alloy for making the pin body 54 is an alloy of copper and 0.2 percent by weight of zirconium. Plated over the body 54 is a first layer 56 of nickel, and over that is a second layer 58 of gold. Other types of pins and coatings can also be used.

The pin 30 is upset by applying an axial force to its ends. The upsetting causes the wedging action previously described adjacent the bottom surface 26 of the base 22, and also causes some enlargement of the diameter of the portion of the pin 30 that is within the bore 28. The top 32 of the pin 30 is flared outwardly to contact the first end of the conduction path 42. At the same time, the top 32 of the pin 30 and the first end of the conduction path 42 are heated to a temperature that is estimated to be about 800° C. by passing an electrical current through the pin 30. The temperature reached is above the eutectic temperature of silver and copper, which is known to be about 780° C. At this temperature, there is a local melting at the points of contact between the pin 30 and the conduction path 42, to form melted contacts 60. These melted contacts 60 are depicted in section in FIG. 6, and in plan view in FIG. 7.

Figure 7:
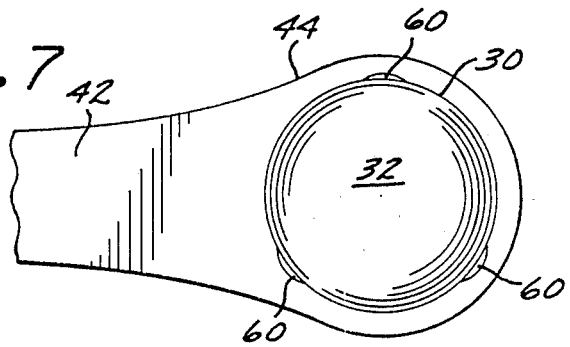
FIG. 7 is a plan view of the joint between an electrical conduction trace and a pin.

The melted contacts 60 typically do not extend around the entire circumference of the pin 30, but instead are localized to a few discrete areas, as illustrated in FIG. 7. However, these discrete areas are sufficient to perform two key functions. First, the melting and formation of the melted contacts 60 create a metallurgical bond that anchors and fixes the pins 30 to the base 22, reducing the possibility that the pins 30 will loosen and fall out during their service lives. Second, the melted contacts 60 form an electrical connection between the conduction trace 42 and the pin 30, which is more securely formed and has less electrical resistance than a mechanical friction contact.

The top surface 24 and the conduction traces 42 can be covered with a layer of glass insulation 62, to protect and insulate them. Application of the insulation is normally performed prior to the upsetting operation, so that the tops 32 of the pins 30 are not covered by glass. This provides access to the tops 32 of the pins 30 for the mechanical upsetting operation, and for electrical test purposes. The latter access is a significant advantage, as servicemen and others can test pin voltages readily after the package 20 is installed, simply by contacting the tops 32 of the pins 30 with a probe.

The package 20 can also be provided with a standoff capability, so that the bottom surface 26 of the base 26 does not directly contact the socket into which it is inserted, but is spaced above the socket some preselected distance. The standoff capability is provided by a standoff pin 64, illustrated in FIG. 5. Where standoff capability is required, several of the standoff pins 64 replace a like number of the conventional pins illustrated in FIG. 3. The standoff pin 64 has a first axial region 70 with a diameter smaller than the diameter of the bore 28. The diameter is enlarged to a size greater than the diameter of the bore 28 in a second axial region 72. The standoff pin 64 has a standoff enlargement 66 located below the collar engagement 52, toward the bottom 34 of the pin 30. The standoff enlargement 66 is a portion of the pin 64 having a further enlarged diameter in a third axial region 74. Below the third axial region, the diameter of the pin is reduced to a smaller value, forming a downwardly facing shoulder 76 that seats against the socket when the base 22 is inserted into the socket. By way of example, for the preferred pin configuration wherein the portion of the pin within the bore 28 is 0.019 inches, the diameter of the standoff enlargement 66 is preferably about 0.050 inches. The diameter of the pin 64 gradually increases with increasing distance toward the bottom 34 to reach the maximum enlargement diameter.

The construction of the pins 30 and 64 yields important advantages when they are inserted into the base 22 and anchored in the upsetting operation. The electrical contacts of the upsetting device contact the top of the pin and the bottom of the collar engagement 52 or the shoulder 76, respectively, so that the electrical current flows through the included portion of the pin. The pin profile is designed so that the current density is greatest near the top of the pin, causing the top to be preferentially heated. The greater diameter of the remainder of the pin results in reduced current density, less heating, and less bending and warping of the pin when it is heated. The pin can therefore be fixed in place by upsetting with an electrical current passed through the pin to heat the top. This approach is technically superior to brazing, as used previously, and is less costly.

Figure 8:
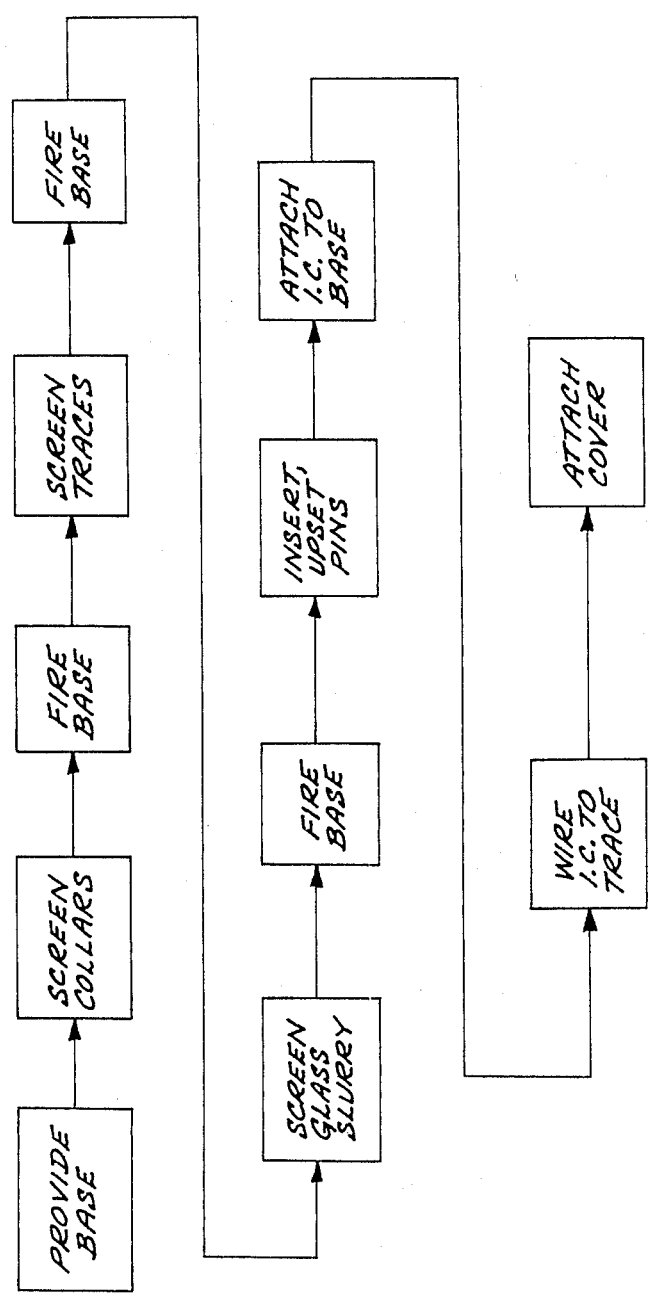
FIG. 8 is a flow chart for the fabrication of a preferred package according to the invention.

A process for preparing the package 20 of the invention is illustrated in FIG. 8. The ceramic base 22 having the bores 28 therein is first prepared. The collars 50 are screened onto the bottom surface 26, and the ceramic base 22 is fired at 850° to 950° C. The conduction paths 42 are screened onto the top surface 24, and the ceramic base 22 is again fired at 850° to 950° C. A slurry of glass particles in a carrier liquid is screened onto the top surface 24 in the desired pattern. The slurry is fired at about 430° C. Finally, the pins 30 (and 64, if desired) are inserted into the base 22 upwardly, and upset in a single operation that wedges the collar between the pin and the bore, and forms the melted contacts 60.

FIG. 8 also depicts three final steps that are not normally performed by the manufacturer of the package 20. After the pins are inserted and upset, and the package inspected, the package is shipped to the manufacturer of the electronic device for its installation and wiring. The integrated circuit is attached at the device location. The fine wires 48 are bonded to the pads 40 of the integrated circuit 36 and to the second ends 46 of the conduction traces 42, in the appropriate patterns, to complete the electrical connection between the integrated circuit 36 and the pins 30. Finally and optionally, a protective cover 68 may be installed over the integrated circuit 30, to form the final package shown in FIG. 2. An optional organic protective coating can be applied over the tops of the pins 30, to prevent bridging between the pins in high humidity environments and high power applications.

Because of the reduced numbers of processing steps and the simplicity of the construction, as compared with prior approaches, the cost of the package 20 of the invention is substantially less than comparable prior packages. The cost of producing the present package is about 3 cents per pin, as compared with a cost of at least 5-6 cents per pin by prior approaches. Moreover, the reliability of the package of the invention is substantially improved over prior packages, due to the modified construction.

The preferred embodiment of the pin grid array package is termed a single layer array module (or SLAM). The approaches of the present invention may be applicable in other contexts.

It will now be seen that the present invention provides cost and technical advantages as discussed above. Although particular embodiments of the invention have been described in detail for purposes of illustration, various modifications may be made without departing from the spirit and scope of the invention. Accordingly, the invention is not to be limited except as by the appended claims.

What is claimed is:

1. A hermetic pin grid array package for supporting an electronic device, comprising:

an electrically insulating, moisture impervious base having a plurality of bores therethrough and adapted for supporting the electronic device thereupon at a device location;

a plurality of electrically conducting pins, one pin extending through each of said bores and having a size of the portion of said pin within said bore that is less than the size of said bore so that there is a clearance gap between said pin and said bore, said pins communicating with a top side of said base and extending through said base to emerge on a bottom side of said base;

means for preventing foreign matter from entering into the clearance gap between each of said pins and said bores, from the bottom side of said base, said means for preventing being a separate element from, and non-integral with, said pins, said means for preventing being a plurality of metallic collars, one around each of said pins and positioned to contact the bottom side of said base where said pin emerges from said base, each of said collars being wedged between said pin and said bore to prevent foreign matter from entering into the clearance gap from the bottom side of said base, the collars being formed as a metallic layer deposited upon the bottom side of said base; and means for electrically connecting said pins to the electronic device in a selected pattern.

2. The package of claim 1, further including an electronic device mounted upon said base.

3. The package of claim 1, wherein said means for electrically connecting includes a metallic conductor adjacent the portion of said pins that communicates with the top side of said base, the composition of at least a portion of said pins and said metallic conductor being selected to form a eutectic alloy composition therebetween, and wherein said package further includes:

a melted bond between each of said pins and the portion of said metallic conductor adjacent said pin.

4. The package of claim 1, wherein said means for electrically connecting includes a metallic conductor trace imprinted upon said base and extending from a point adjacent the device location to one of said pins, said metallic conductor trace being a metallic alloy consisting essentially of silver plus from about 1.5 weight percent to about 2.5 weight percent platinum.

5. The package of claim 1, wherein said base is made of a ceramic material.

6. The package of claim 1, wherein at least some of said pins are standoff pins, said pins having a first axial region with a diameter less than that of said bores, a second axial region with a diameter greater than that of said bores, and a third axial region with a diameter greater than that of said second axial region, said third region having a downwardly facing shoulder thereon.

7. A hermetic pin grid array package for supporting an electronic device, comprising:

an electrically insulating, moisture impervious base having a plurality of bores therethrough and adapted for supporting the electronic device thereupon at a device location;

a plurality of electrically conducting pins, one extending through each of said bores, said pins communicating with a top side of said base and extending through said base to emerge on a bottom side of said base;

means for electrically connecting said pins to the electronic device in a selected pattern, said means including a metallic conductor adjacent the portion of said pins that communicates with the top side of said base, the composition of at least a portion of said pins and said metallic conductor being selected to form a eutectic alloy composition therebetween; and a melted bond between each of said pins and the portion of said metallic conductor adjacent said pin.

8. The package of claim 7, further including an electronic device mounted upon said base.

9. The package of claim 7, wherein said base is made of a ceramic.

10. A hermetic pin grid array package for supporting an electronic device, comprising:

an electrically insulating, moisture impervious base having a plurality of bores therethrough and adapted for supporting the electronic device at a device location thereupon;

a plurality of electrically conducting pins, one extending through each of said bores, said pins communicating with a top side of said base and extending through said base to emerge on a bottom side of said base; and means for electrically connecting said pins to the electronic device in a selected pattern, said means including a metallic conductor trace imprinted upon said base and extending from a point adjacent the device location to one of said pins, said metallic conductor trace being formed of a metallic alloy consisting essentially of silver plus from about 1.5 weight percent to about 2.5 weight percent platinum.

11. The package of claim 10, further including an electronic device mounted upon said base.

12. The package of claim 10, wherein said base is made of a ceramic.

13. A hermetic pin grid array package for supporting an electronic device, comprising:

a ceramic base having a plurality of bores therethrough and adapted for supporting the electronic device at a device location thereupon;

a plurality of electrically conducting pins formed of a copper containing alloy, one extending through each of said bores, said pins communicating with a top side of said base and extending through said base to emerge on a bottom side of said base;

a plurality of metallic collars, one surrounding each of said pins and positioned to contact the bottom side of said base where said pin emerges from said base, each of said collars being wedged between said pin and said bore to exclude foreign matter from entering into said bore from the bottom side of said base;

means for electrically connecting said pins to the electronic device in a selected pattern, said means including a metallic conductor trace imprinted upon said base and extending from a point adjacent the device location to one of said pins, said metallic conductor trace being a metallic alloy consisting essentially of silver plus from about 1.5 weight percent to about 2.5 weight percent platinum; and a melted copper-silver eutectic bond between each of said pins and the portion of said metallic conductor trace adjacent said pin.

14. The package of claim 13, wherein said collar is a metallic layer deposited upon the bottom side of said base.

15. The package of claim 13, further including a glassy insulating coating over at least a portion of the top side of said base and said means for electrically connecting.

16. The package of claim 13, further including an electronic device mounted upon said base.

17. The package of claim 13, wherein said ceramic base is made of a material selected from the group consisting of aluminum oxide, beryllium oxide, and aluminum nitride.

18. The package of claim 13, wherein at least some of said pins are standoff pins, said pins having a first axial region with a diameter less than that of said bores, a second axial region with a diameter greater than that of said bores, and a third axial region with a diameter greater than that of said second axial region, said third region having a downwardly facing shoulder thereon.

* * * * *